(12) United States Patent
Fertsch et al.

(10) Patent No.: US 11,489,518 B2
(45) Date of Patent: Nov. 1, 2022

(54) INVERTER-BASED DELAY ELEMENT WITH ADJUSTABLE CURRENT SOURCE/SINK TO REDUCE DELAY SENSITIVITY TO PROCESS AND SUPPLY VOLTAGE VARIATION

(71) Applicant: QUALCOMM Incorporated, San Diego, CA (US)

(72) Inventors: Michael Fertsch, Oceanside, CA (US); Ashwin Sethuram, San Clemente, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/194,084

(22) Filed: Mar. 5, 2021

(65) Prior Publication Data

US 2022/0286121 A1    Sep. 8, 2022

(51) Int. Cl.
*H03K 5/134* (2014.01)
*H03L 7/089* (2006.01)
(Continued)

(52) U.S. Cl.
CPC ........... *H03K 5/134* (2014.07); *H03L 7/0891* (2013.01); *H03L 7/0995* (2013.01); *H04B 1/38* (2013.01);
(Continued)

(58) Field of Classification Search
CPC ......... H03K 5/134; H03K 2005/00019; H03K 2005/00195; H03L 7/0891; H03L 7/0995; H04B 1/38
See application file for complete search history.

(56) References Cited

U.S. PATENT DOCUMENTS 5,175,452 A * 12/1992 Lupi ...................... H03K 5/133
                                                           331/177 R
5,175,512 A * 12/1992 Self ........................ H03K 3/011
                                                                  331/8
(Continued)

FOREIGN PATENT DOCUMENTS

EP        1178610 A2 *  2/2002        ............. H03K 3/013
EP        1408611 A2     4/2004
KR    20170043748 A *    4/2017

OTHER PUBLICATIONS

Nagaraju, M., et al., "Process-Variation Tolerant Design Techniques for Multiphase Clock Generation", Electronics, Circuits, and Systems (ICECS), 2010 17th IEEE International Conference on, IEEE, Dec. 12, 2010 (Dec. 12, 2010) XP031922920, pp. 102-105, DOI: 10.1109/ICECS.2010.5724464, ISBN: 978-1-4244-8155-2, Section 1, Figure 1, Section 2.2, Figures 3,4.

(Continued)

*Primary Examiner* — Adam D Houston
(74) *Attorney, Agent, or Firm* — Loza & Loza, LLP (57) ABSTRACT

A delay element including a first set of field effect transistors (FETs) with gates configured to receive a first control voltage; a second set of FETs coupled in series with the first set of FETs between a first voltage rail and a first node, respectively, the second set of FETs include gates configured to receive a set of complementary select signals, respectively; a third set of FETs including gates configured to receive a set of non-complementary select signals, respectively; a fourth set of FETs coupled in series with the third set of FETs between a second node and a second voltage rail, respectively, the fourth set of FETs including gates configured to receive a second control voltage; and an inverter coupled between the first node and the second node, the inverter including an input configured to receive an input signal and an output configured to produce an output signal.

26 Claims, 5 Drawing Sheets

(51) Int. Cl.
*H04B 1/38* (2015.01)
*H03L 7/099* (2006.01)
*H03K 5/00* (2006.01)

(52) U.S. Cl.
CPC .............. *H03K 2005/00019* (2013.01); *H03K 2005/00195* (2013.01)

(56) References Cited

U.S. PATENT DOCUMENTS

| | | | | |
|---|---|---|---|---|
| 5,317,219 A * | 5/1994 | Lupi | ...................... | H03K 5/133 327/261 |
| 5,331,295 A * | 7/1994 | Jelinek | ...................... | H03L 1/00 331/17 |
| 5,559,477 A * | 9/1996 | Tozun | .................... | H03L 7/0995 331/34 |
| 5,568,103 A | 10/1996 | Nakashima et al. | | |
| 5,598,364 A * | 1/1997 | McCall | .................... | H03K 5/135 365/76 |
| 6,054,904 A * | 4/2000 | Katoh | .................... | H03L 7/0895 331/34 |
| 6,115,769 A * | 9/2000 | Anderson | .............. | H03K 5/133 710/305 |
| 6,603,340 B2 * | 8/2003 | Tachimori | ............. | H03L 7/0995 327/261 |
| 7,084,684 B2 * | 8/2006 | Kim | ........................ | H03K 5/133 327/284 |
| 7,260,424 B2 * | 8/2007 | Schmidt | ................... | H04B 1/38 455/550.1 |
| 7,330,081 B1 * | 2/2008 | Asa | ....................... | H03K 3/0315 331/186 |
| 7,542,862 B2 * | 6/2009 | Singh | ................. | G01R 31/2874 702/80 |
| 7,548,823 B2 * | 6/2009 | Singh | ................. | G01R 31/3016 702/57 |
| 7,551,012 B2 * | 6/2009 | Mai | ....................... | H03L 7/0895 327/158 |
| 9,438,205 B2 * | 9/2016 | Kim | ........................ | H03K 3/011 |
| 10,804,797 B1 * | 10/2020 | Nagulapalli | ........... | H03L 7/0896 |
| 2002/0186072 A1 * | 12/2002 | Mano | .................... | H03L 7/0995 327/538 |
| 2004/0207474 A1 * | 10/2004 | Milani | .................. | H03L 7/0891 331/16 |
| 2004/0251973 A1 * | 12/2004 | Ishida | .................. | H03K 3/0322 331/16 |
| 2005/0046497 A1 * | 3/2005 | Nakanishi | ............... | H03L 7/099 331/57 |
| 2007/0152761 A1 * | 7/2007 | Kim | ......................... | H03L 7/093 331/16 |
| 2008/0278201 A1 | 11/2008 | Lee | | |
| 2008/0284529 A1 * | 11/2008 | Refeld | .................... | H03K 5/133 327/551 |
| 2008/0288196 A1 * | 11/2008 | Singh | .................. | G01R 31/3016 702/89 |
| 2008/0288197 A1 * | 11/2008 | Singh | .................. | G01R 31/2874 702/79 |
| 2011/0074385 A1 * | 3/2011 | Sunaga | .............. | G01R 31/3016 324/76.11 |
| 2012/0223778 A1 * | 9/2012 | Shin | ...................... | H03L 7/0995 331/34 |
| 2013/0208550 A1 | 8/2013 | Sforzin | | |
| 2015/0221285 A1 * | 8/2015 | Song | ..................... | H03L 7/0995 345/82 |
| 2015/0296452 A1 | 10/2015 | Hu et al. | | |
| 2018/0287593 A1 * | 10/2018 | Tsai | ...................... | H03K 3/0315 |
| 2019/0036749 A1 * | 1/2019 | Erez | ...................... | H04L 27/364 |
| 2019/0273483 A1 * | 9/2019 | Toyama | ............... | H03K 3/0315 |
| 2021/0143807 A1 * | 5/2021 | Kim | ........................ | H03L 7/07 |
| 2021/0305989 A1 * | 9/2021 | Han | ....................... | H03K 5/131 |

OTHER PUBLICATIONS

Partial International Search Report—PCT/US2022/016994—ISA/EPO—dated May 27, 2022.

Seo, S-Y., et al., "A Digitally Controlled Oscillator With Wide Frequency Range and Low Supply Sensitivity", IEEE Transactions on Circuits and Systems II: Express Briefs, IEEE, USA, vol. 58, No. 10, Oct. 1, 2011 (Oct. 1, 2011), XP011363367, pp. 632-636, ISSN: 1549-7747, DOI: 10.1109/TCSII.2011.2164146, Section I, Figure 1, Section III, Figures 4,5,7.

International Search Report and Written Opinion—PCT/US2022/016994—ISA/EPO—dated Aug. 16, 2022.

* cited by examiner

INVERTER-BASED DELAY ELEMENT WITH ADJUSTABLE CURRENT SOURCE/SINK TO REDUCE DELAY SENSITIVITY TO PROCESS AND SUPPLY VOLTAGE VARIATION

FIELD

Aspects of the present disclosure relate generally to signal delay elements, and in particular, to an inverter-based delay element with adjustable current source/sink to reduce or control delay sensitivity to process and supply voltage variation.

BACKGROUND

An integrated circuit (IC) may include a plurality of delay elements to perform various operations. For example, delay elements may be used to time align two or more signals, such as a data signal to a corresponding clock signal, and/or vice-versa. Delay elements may also be used in oscillators, such as a ring oscillator, to generate a clock signal, which may be a substantially periodic timing signal used by sequential data circuits. The performance of such delay elements is of interest in the present disclosure.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes a delay element including: a first set of field effect transistors (FETs) including a first set of gates coupled together and configured to receive a first control voltage; a second set of FETs coupled in series with the first set of FETs between a first voltage rail and a first node, respectively, wherein the second set of FETs include a second set of gates configured to receive a set of complementary select signals, respectively; a third set of FETs, wherein the third set of FETs include a third set of gates configured to receive a set of non-complementary select signals, respectively; a fourth set of FETs coupled in series with the third set of FETs between a second node and a second voltage rail, respectively, wherein the fourth set of FETs include a fourth set of gates coupled together and configured to receive a second control voltage; and an inverter coupled between the first node and the second node, wherein the inverter includes an input configured to receive an input signal and an output configured to produce an output signal.

Another aspect of the disclosure relates to a method. The method includes determining a process speed associated with or a supply voltage provided to a delay element, wherein the delay element comprises a current source, an inverter, and a current sink coupled in series between first and second voltage rails; providing a control signal to set a size of the current source and the current sink based on the process speed or the supply voltage; and providing a current control voltage to the current source and the current sink to set a delay between an input signal applied to an input of the inverter and an output signal produced at an output of the inverter.

Another aspect of the disclosure relates to an apparatus. The apparatus includes means for determining a process speed associated with or a supply voltage provided to a delay element, wherein the delay element comprises a current source, an inverter, and a current sink coupled in series between first and second voltage rails; means for providing a control signal to set a size of the current source and the current sink based on the process speed or the supply voltage; and means for providing a current control voltage to the current source and the current sink to set a delay between an input signal applied to an input of the inverter and an output signal produced at an output of the inverter.

Another aspect of the disclosure relates to a wireless communication device. The wireless communication device includes a memory device; a memory interface coupled to the memory device, wherein the memory interface comprises a plurality of delay elements each including: a first set of field effect transistors (FETs) including a first set of gates coupled together and configured to receive a first control voltage; a second set of FETs coupled in series with the first set of FETs between a first voltage rail and a first node, respectively, wherein the second set of FETs include a second set of gates configured to receive a set of complementary select signals, respectively; a third set of FETs, wherein the third set of FETs include a third set of gates configured to receive a set of non-complementary select signals, respectively; a fourth set of FETs coupled in series with the third set of FETs between a second node and a second voltage rail, respectively, wherein the fourth set of FETs include a fourth set of gates coupled together and configured to receive a second control voltage; and an inverter coupled between the first node and the second node, wherein the inverter includes an input configured to receive an input signal and an output configured to produce an output signal. The wireless communication device may further include at least one digital signal processing cores coupled to the memory interface; a transceiver coupled to the at least one digital signal processing cores; and at least one antenna coupled to the transceiver.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
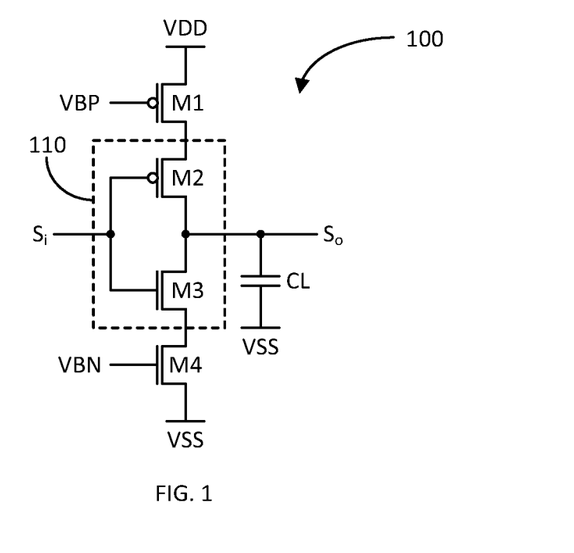
FIG. 1 illustrates a block diagram of an example inverter-based delay element in accordance with an aspect of the disclosure.

FIG. 1 illustrates a schematic diagram of an inverter-based delay element 100 (also referred to as a current starved inverter) in accordance with an aspect of the disclosure.

The delay element 100 includes a current source configured as a p-channel metal oxide semiconductor field effect transistor (PMOS FET) M1, an inverter 110 including a PMOS FET M2 and an n-channel metal oxide semiconductor field effect transistor (NMOS FET) M3, and a current sink configured as an NMOS FET M4, all coupled or connected in series between an upper voltage rail VDD and a lower voltage rail VSS (e.g., ground).

The gates of the PMOS FET M2 and NMOS FET M3 of the inverter 110 are coupled together, and serves as an input to the delay element 100 to receive an input signal $S_i$ to be delayed. The drains of the PMOS FET M2 and NMOS FET M3 of the inverter 110 are coupled together, and serves as an output of the delay element 100 to produce an output signal $S_o$ being a delayed version of the input signal. The current source PMOS FET M1 and the current sink NMOS FET M2 include gates to receive control voltages VBP and VBN to set a particular delay of the delay element 100, respectively.

The delay of the delay element 100 is related to a pull-up delay (Tup) summed with a pull-down delay (Tdown). The pull-up delay (Tup) may be given by the following relationship:

$$Tup = CL/Iup = CL/(M*\mu_p*(VTH_p - VBP)^2) \qquad \text{Eq. 1}$$

Where CL is the load capacitance presented to the output of the delay element 100, Iup is the pull-up current, M is the size (e.g., effective channel width to channel length ratio (W/L)) of the PMOS FET M1, $\mu_p$ is the mobility of the carriers (holes) in the PMOS FET M1, $VTH_p$ is the threshold voltage of the PMOS FET M1, and VBP is the control voltage applied to the gate of the PMOS FET M1. Alternatively, the PMOS FET M1 may be made up of a plurality of PMOS FETs, each having the same size, coupled in parallel, and M can refer to the number of the PMOS FETs turned on (activated).

Similarly, the pull-down delay (Tdown) may be given by the following relationship:

$$Tdown = CL/Idown = CL/(M*\mu_n*(VBN - VTH_n)^2) \qquad \text{Eq. 2}$$

Where CL is the load capacitance presented to the output of the delay element 100, Idown is the pull-down current, M is the size (W/L) of the NMOS FET M4, $\mu_n$ is the mobility of the carriers (electrons) in the NMOS FET M4, $VTH_1$ is the threshold voltage of the NMOS FET M4, and VBN is the control voltage applied to the gate of the NMOS FET M4. Alternatively, the NMOS FET M4 may be made up of a plurality of NMOS FETs, each having the same size, coupled in parallel, and M can refer to the number of the NMOS FETs turned on (activated).

Considering Tdown (as the following explanation is also applicable to Tup), and assuming the size of the FETs M1 and M4 are substantially the same (e.g., within process tolerances), at slow process corners where the load capacitance CL is relatively high and the mobility of the carriers $\mu_a$ is relatively low, to achieve a particular target delay Tdown, the difference in the gate and threshold voltages $VBN-VTH_n$ may be relatively high according to Eq. 2. At fast process corners, where the load capacitance CL is relatively low and the mobility of the carriers $\mu_a$ is relatively high, to achieve the same target delay Tdown, the difference in the gate and threshold voltages $VBN-VTH_n$ should be relatively low according to Eq. 2. The difference in the gate and threshold voltages VBN-VTH may also be referred to as the drive of the corresponding FET.

Figure 2:
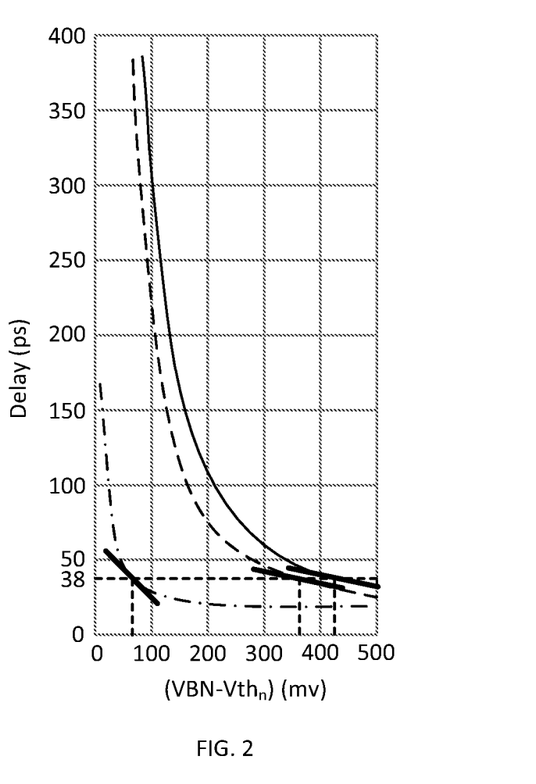
FIG. 2 illustrates a graph depicting a relationship between a delay versus current source/sink drive associated with an inverter-based delay element in accordance with another aspect of the disclosure.

FIG. 2 illustrates a graph depicting the relationship between the delay of the delay element 100 and the difference between the gate control voltage and the threshold voltage $VBN-VTH_n$ (drive) of the NMOS FET M4. The y- or vertical axis represents the delay in picosecond (ps), and the x- or horizontal axis represents the voltage difference in millivolt (mv) between the gate control voltage and the threshold voltage $VBN-VTH_n$ of the NMOS FET M4. It shall be understood that the voltage difference between the threshold voltage and the gate control voltage $VTH_p-VBP$ of the PMOS FET M1 may be similar to that of $VBN-VTH_n$ (e.g., such that Tup is substantially equal to Tdown).

The solid line plot pertains to a relatively slow process corner with a relatively large device size M of 12, the dash-dot line plot pertains to a relatively fast process corner with the device size M also being 12, and the large dashed line plot pertains to the fast process corner with a smaller device size M of two (2). In this example, a target delay for the delay element 100 is 38 ps, as represented by the horizontal small dashed line plot, and the vertical dash line plots maps the target delay line to corresponding drive ($VBN-VTH_n$) of the NMOS FET M4.

Note that at the slow process corner (solid line plot), the $VBN-VTH_n$ to achieve the 38 ps target delay is around 425 mV, and the slow process corner plot is relatively flat at that region as indicated by the thick line representing the slope of the plot; meaning that the sensitivity of the delay to the threshold voltage $VTH_n$ variation is relatively small.

On the other hand, at the fast process corner/large M (dashed-dot line plot), the $VBN-VTH_n$ to achieve the 38 ps delay is around 80 mV, and the fast process corner/large M plot has a relatively high slope at that region as indicated by the corresponding thick slope line; meaning that the sensitivity of the delay to threshold voltage $VTH_n$ variation is relatively high.

Thus, the higher $VBN-VTH_n$, the lower is the sensitivity of the delay to threshold voltage VTH variation. As the threshold voltage VTH may vary significantly across an integrated circuit (IC) die, at fast corners, there may be significant variation in the resulting delays of delay elements located at different regions of the IC.

In summary, with reference again to FIG. 2 and Eq. 2, if at fast corners, the effective size M of the FETs M1 and M4 can be made smaller, the $VBN-VTH_n$ can be made higher. As illustrated in FIG. 2, the large dashed line plot pertains to a fast process corner with a smaller M (e.g., M=2). Thus, using the target delay of 38 ps, at the fast corner with the smaller device size M=2, the $VBN-VTH_n$ is at around 370 mV, which is at a region that is relatively flat (as indicated by the corresponding thick slope line) compared to that of the fast corner and larger device size M=12. Thus, the sensitivity of the delay to threshold voltage VTH variation is relatively small.

Thus, by adjusting M based on the process corner (e.g., slow corner→high M; fast corner→low M), the sensitivity to delay to threshold voltage variation may be kept small for delay elements instantiated throughout an IC.

Figure 3:
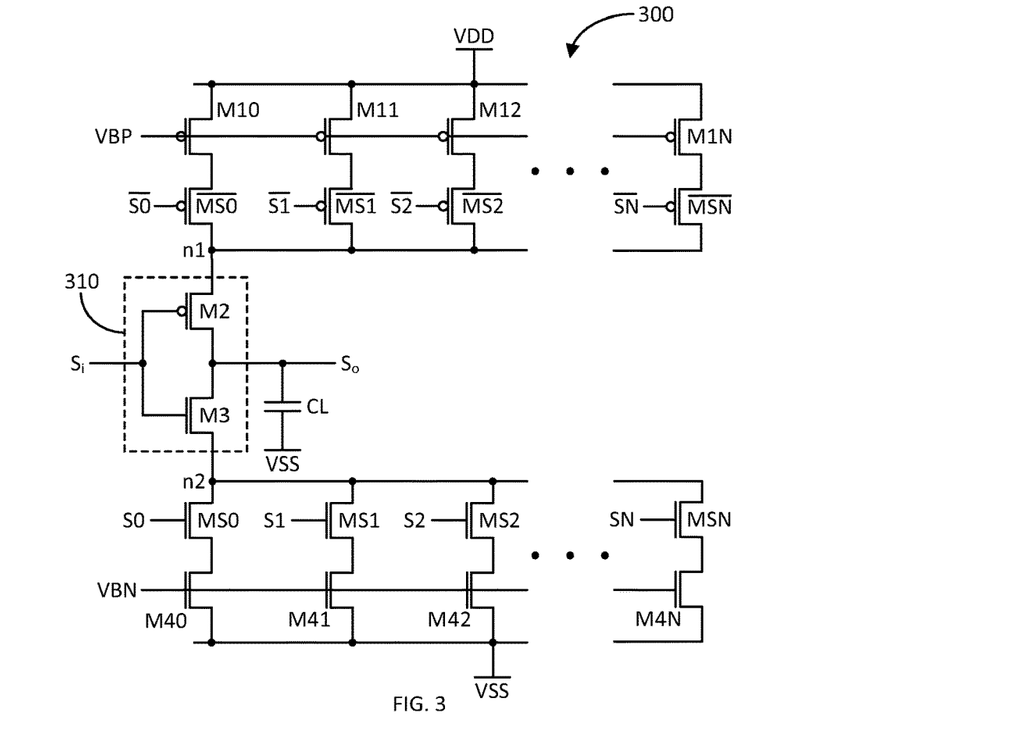
FIG. 3 illustrates a schematic diagram of another example inverter-based delay element in accordance with another aspect of the disclosure.

FIG. 3 illustrates a schematic diagram of an inverter-based delay element 300 in accordance with another aspect of the disclosure. The delay element 300 includes a first set of PMOS FETs M10 to M1N including a first set of gates coupled together, and configured to receive a first control voltage VBP, where N is an integer. The delay element 300 further includes a second set of PMOS FETs $\overline{MS0}$ to $\overline{MSN}$ coupled or connected in series with the first set of FETs M10 to M1N between an upper voltage rail VDD and a first node n1, respectively. The second set of FETs $\overline{MS0}$ to $\overline{MSN}$ include a second set of gates configured to receive a set of complementary select signals $\overline{S0}$ to $\overline{SN}$, respectively.

The delay element 300 further includes a third set of FETs MS0 to MSN, wherein the third set of FETs MS0 to MSN include a third set of gates configured to receive a set of non-complementary select signals S0 to SN, respectively. Additionally, the delay element 300 includes a fourth set of FETs M40 to M4N coupled in series with the third set of FETs MS0 to MSN between a second node n2 and a lower voltage rail (e.g., ground), respectively. The fourth set of FETs M40 to M4N include a fourth set of gates coupled together and configured to receive a second control voltage VBN.

The delay element 300 also includes an inverter 310 including PMOS FET M2 and NMOS FET M3 coupled or connected in series between nodes n1 and n2, with gates coupled together at an input to receive an input signal $S_i$ to be delayed, and drains coupled together at an output to produce an output signal $S_o$ being a delayed version of the input signal $S_i$.

At slow process corners, the effective size M of the current source (e.g., the number of turned on PMOS FETs $\overline{MS0}$ to $\overline{MSN}$) and current sink (e.g., the number of turned on NMOS FETs MS0 to MSN) may be set relatively large. Accordingly, the sets of complementary and non-complementary select signals $\overline{S0}$ to $\overline{SN}$ and S0 to SN may be configured to turn on many or all of the sets of PMOS FETs $\overline{MS0}$ to $\overline{MSN}$ and NMOS FETs MS0 to MSN, respectively. For example, at a particular relatively slow process speed, the number of PMOS FETs $\overline{MS0}$ to $\overline{MSN}$ and NMOS FETs MS0 to MSN turned on may be nine (9), and turned off may be three (3) for the case where N=11. In such case, the sets of complementary and non-complementary select signals $\overline{S0}$ to $\overline{S8}$ and S0 to S8 are at VSS and VDD potentials, respectively; and the sets of complementary and non-complementary select signals $\overline{S9}$ to $\overline{S11}$ and S9 to S11 are at VDD and VSS potentials, respectively. Or, in another case, all of the PMOS FETs $\overline{MS0}$ to $\overline{MSN}$ and NMOS FETs MS0 to MSN are turned on; in which case, the sets of complementary and non-complementary select signals $\overline{S0}$ to $\overline{S11}$ and S0 to S11 are at VSS and VDD potentials, respectively.

At fast process corners, the effective size M of the current source (e.g., the number of turned on PMOS FETs $\overline{MS0}$ to $\overline{MSN}$) and current sink (e.g., the number of turned on NMOS FETs MS0 to MSN) may be set relatively small. Accordingly, the sets of complementary and non-complementary select signals S0 to SN and S0 to SN may be configured to turn only a few of the sets of PMOS FETs MS0 to MSN and NMOS FETs MS0 to MSN. For example, at a particular relatively fast process speed, the number of PMOS FETs $\overline{MS0}$ to $\overline{MSN}$ and NMOS FETs MS0 to MSN turned on may be three (3), and turned off may be nine (9) for the case where N=11. In such case, the sets of complementary and non-complementary select signals $\overline{S0}$ to $\overline{S2}$ and S0 to S2 are at VSS and VDD potentials, respectively; and the sets of complementary and non-complementary select signals $\overline{S3}$ to $\overline{S11}$ and S3 to S11 are at VDD and VSS potentials, respectively. The number of FETs turned on in the fast process corner case is less than the number of FETs turned on in the slow process corner case.

Each of the PMOS FETs $\overline{MS0}$ to $\overline{MSN}$ and NMOS FETs MS0 to MSN may be configured to have substantially the same size. Thus, if a single PMOS FET (one of $\overline{MS0}$ to $\overline{MSN}$) and single NMOS FET (one of MS0 to MSN) is turned on, the effective size M of the current source/current sink may be normalized to one (1). In such case, for example, if nine (9) PMOS FETs $\overline{MS0}$ to $\overline{MS8}$ and NMOS FETs MS0 and MS8 are turned on, and three (3) PMOS FETs $\overline{MS0}$ to $\overline{MS9}$ and NMOS FETs MS9 and MS11 are turned off, the effective size M of the current source/current sink is nine (9). As indicated, if the PMOS FETs $\overline{MS0}$ to $\overline{MSN}$ and NMOS FETs MS0 to MSN are configured to have substantially the same size, the number of PMOS FETs $\overline{MS0}$ to $\overline{MSN}$ that are turned on may be the same as the number of NMOS FETs MS0 to MSN that are turned on. However, it shall be understood that the sizes of the PMOS FETs $\overline{MS0}$ to $\overline{MSN}$ and NMOS FETs MS0 to MSN need not be configured substantially the same.

Further, although the sets of complementary and non-complementary select signals $\overline{S0}$ to $\overline{SN}$ and S0 to SN may all be configurable to turn on and off the corresponding PMOS FETs $\overline{MS0}$ to $\overline{MSN}$ and NMOS FETs MS0 to MSN, it shall be understood that one or more of the select signals may be fixed to maintain the corresponding one of more FETs turned on during operation. For example, considering again the case where N=11, it may be determined that there is a minimum number of PMOS FETs $\overline{MS0}$ to $\overline{MSN}$ and NMOS FETs MS0 to MSN that are on for all use cases. Thus, the corresponding select signals may be configured to keep such minimum number of FETs turned on, such as by fixing the gate voltages to VSS in the case of PMOS FETs and fixing the gate voltages to VDD in the case of NMOS FETs.

Figure 4:
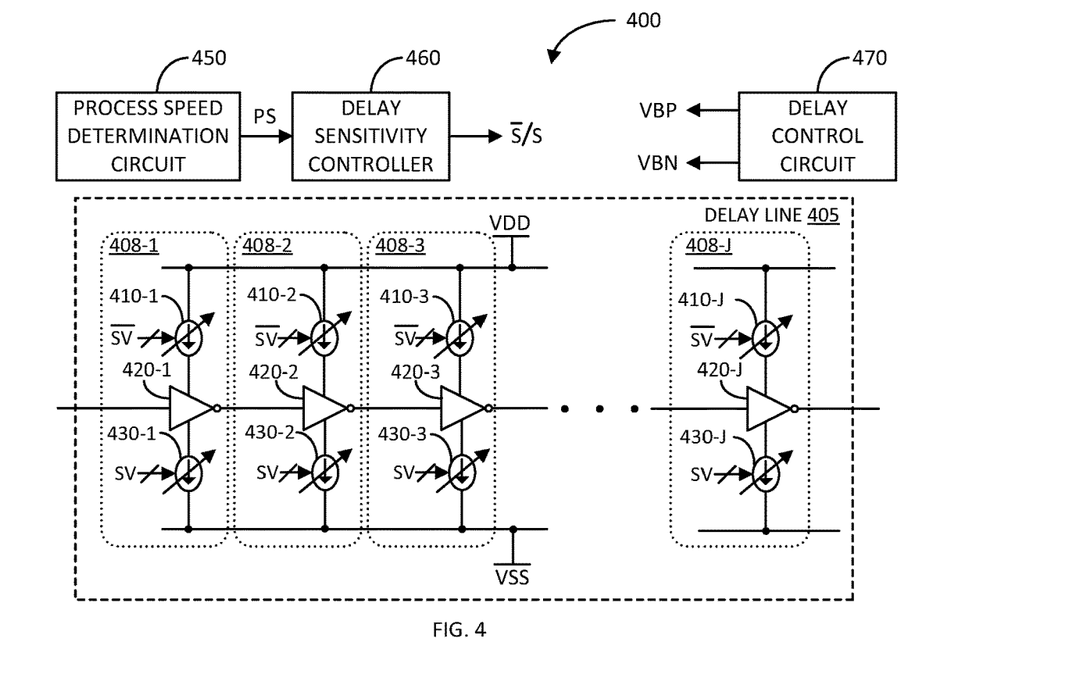
FIG. 4 illustrates a block/schematic diagram of an example delay line system in accordance with another aspect of the disclosure.

FIG. 4 illustrates a block/schematic diagram of an example delay line system 400 in accordance with another aspect of the disclosure. The delay line system 400 includes a delay line 405, a process speed determination circuit 450, a delay sensitivity controller 460, and a delay control circuit 470.

The delay line 405 includes a set of cascaded delay elements 408-1 to 408-J, each of which may be configured similar to delay element 300 previously discussed. For example, the delay line 405 includes a first delay element 408-1 including a current source 410-1, an inverter 420-1, and a current sink 430-1 coupled or connected in series between an upper voltage rail VDD and a lower voltage rail VSS. The current source 410-1 is controlled by a control signal $\overline{S}\overline{V}$, where the $\overline{S}$ portion controls the size of the current source for delay sensitivity purposes, and the $\overline{V}$ portion controls the drive of the current source for delay setting purposes. Similarly, the current sink 430-1 is controlled by a control signal SV, where the S portion controls the size of the current sink for delay sensitivity purposes, and the V portion controls the drive of the current sink for delay setting purposes.

The remaining cascaded delay elements 408-2 to 408-J are similarly configured including current sources 410-2 to 410-J, inverters 420-2 to 420-J, and current sinks 430-2 to 430-J coupled or connected in series between the upper and lower voltage rails VDD and VSS, respectively. The suffix J may be an integer. If the delay line 405 is used to delay an input signal to generate an output signal, the input signal may be applied to an input of the inverter 420-1, and the output signal may be produced at an output of the inverter 420-J. If the delay line 405 is used in a ring oscillator, the output of the inverter 420-J is coupled to the input of the inverter 420-1, where J is an odd integer in this case.

The process speed determination circuit 450 is configured to generate a process speed signal PS indicative of the process speed of an IC, which includes the delay line 405 (e.g., related to the FETs that form the current sources, inverters, and current sinks of the delay line 405). As an example, the process speed determination circuit 450 may be a ring oscillator configured to generate an oscillating signal whose frequency is related to the process speed of the IC. For example, a relatively high frequency indicates a relatively high process speed, and a relatively low frequency indicates a relatively low process speed.

The delay sensitivity controller 460 includes an input coupled to an output of the process speed determination circuit 450. The delay sensitivity controller 460 is configured to generate the current sources and current sinks size setting control signals S and S based on the process speed signal PS, respectively. Accordingly, the delay sensitivity controller 460 includes an output coupled to the current sources and current sinks of the delay line 405 (e.g., to the gates of the FETs that form the current sources and current sinks of the delay line 405).

As previously discussed, to reduce or control the delay sensitivity associated with the delay line 405, the sizes of the current sources and current sinks of the delay elements 408-1 to 408-J of the delay line 405 may be set inversely related to the process speed signal. That is, if the process speed signal PS indicates a relatively low process speed, the sizes of the current sources and sinks may be set relatively large. If the process speed signal PS indicates a relatively high process speed, the sizes of the current sources and sinks may be set relatively low. It shall be understood that there may be more than two size levels (e.g., high and low), but multiple levels (e.g., very high, high, medium, low, very low). Accordingly, the delay sensitivity controller 460 may use an equation or a table to map the process speed to the size setting control signals $\overline{S}$ and S.

The delay control circuit 470 is configured to generate the first and second control voltages VBP and VBN to set the drive of the current sources and current sinks of the delay line 405 to control or set a particular delay of the delay line 405. Accordingly, the delay control circuit 470 includes an output coupled to the current sources and current sinks of the delay line 405 (e.g., to the gates of the FETs that form the current sources and current sinks of the delay line 405). The delay control circuit 470 may generate the control signals VBP and VBN based on the size setting control signals S and S (e.g., or after the size setting control signals S and S have been determined by the delay sensitivity controller 460).

Figure 5:
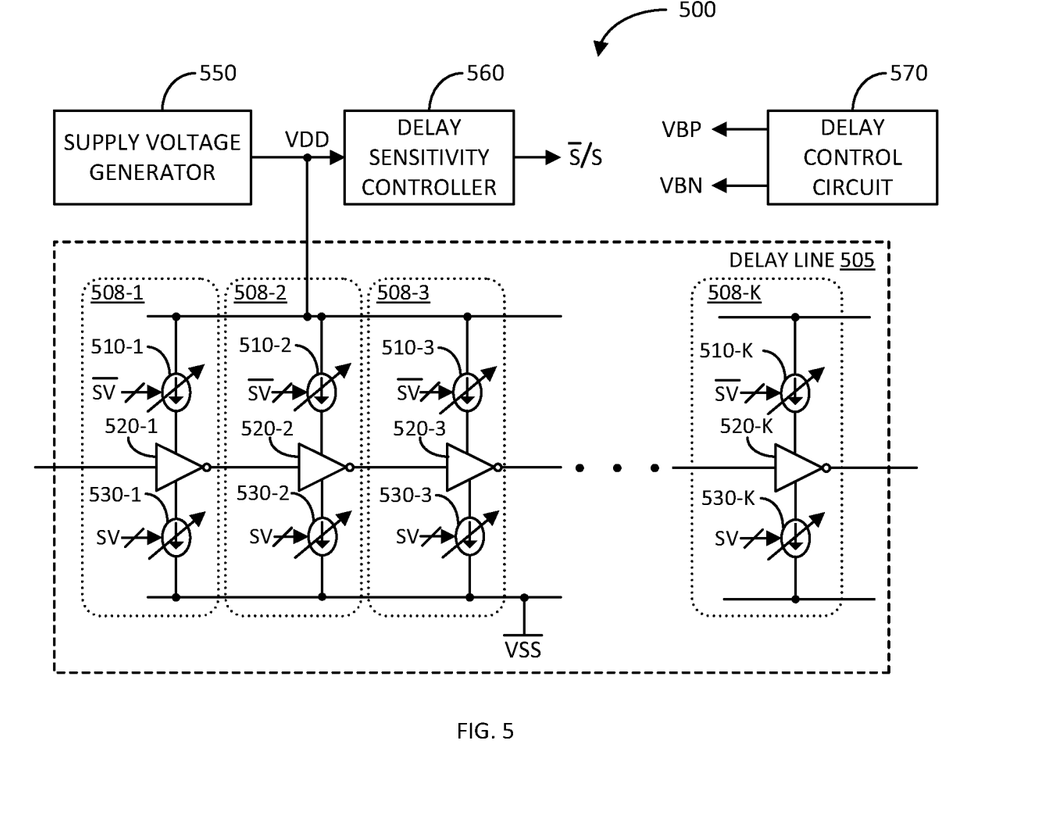
FIG. 5 illustrates a block/schematic diagram of another example delay line system in accordance with another aspect of the disclosure.

FIG. 5 illustrates a block/schematic diagram of an example delay line system 500 in accordance with another aspect of the disclosure. The delay line system 500 includes a delay line 505, a supply voltage generator 550, a delay sensitivity controller 560, and a delay control circuit 570.

The delay line 505 includes a set of cascaded delay elements 508-1 to 508-K, each of which may be configured similar to delay element 300 previously discussed. For example, the delay line 505 includes a first delay element 508-1 including a current source 510-1, an inverter 520-1, and a current sink 530-1 coupled or connected in series between an upper voltage rail VDD and a lower voltage rail VSS. The current source 510-1 is controlled by a control signal $\overline{S}\overline{V}$, where the $\overline{S}$ portion controls the size of the current source for delay sensitivity purposes, and the $\overline{V}$ portion controls the drive of the current source for delay setting purposes. Similarly, the current sink 530-1 is controlled by a control signal SV, where the S portion controls the size of the current sink for delay sensitivity purposes, and the V portion controls the drive of the current sink for delay setting purposes.

The remaining cascaded delay elements 508-2 to 508-K are similarly configured including current sources 510-2 to 510-K, inverters 520-2 to 520-K, and current sinks 530-2 to 530-K coupled or connected in series between the upper and lower voltage rails VDD and VSS, respectively. The suffix K may be an integer. If the delay line 505 is used to delay an input signal to generate an output signal, the input signal may be applied to an input of the inverter 520-1, and the output signal may be produced at an output of the inverter 520-K. If the delay line 505 is used in a ring oscillator, the output of the inverter 520-K is coupled to the input of the inverter 520-1, where K is an odd integer in this case.

The supply voltage generator 550 is configured to generate a supply voltage VDD for the upper voltage rail of the delay line 505, or more accurately, to set a supply voltage difference (VDD-VSS) between the upper and lower voltage rails. This may be done to operate the delay line 505 for different frequencies or bandwidths. For example, to operate the delay line 505 at relatively high frequencies or bandwidths, the supply voltage difference (VDD-VSS) may be set relatively high to reduce the delay of the delay line 505. Conversely, to operate the delay line 505 at relatively low frequencies or bandwidths, the supply voltage difference (VDD-VSS) may be set relatively low to reduce power consumption.

The delay sensitivity controller 560 includes an input coupled to an output of the supply voltage generator 550. The delay sensitivity controller 560 is configured to generate the current sources and current sinks size setting control signals S and S based on the supply voltage difference (VDD-VSS, or VDD as VSS may be fixed to a particular potential, such as ground), respectively. Accordingly, the delay sensitivity controller 560 includes an output coupled to the current sources and current sinks of the delay line 505 (e.g., to the gates of the FETs that form the current sources and current sinks of the delay line 505).

As previously discussed, to reduce or control the delay sensitivity associated with the delay line 505, the sizes of the current sources and current sinks of the delay elements of the delay line 505 may be set inversely related to the supply voltage difference VDD-VSS. That is, if the supply voltage difference VDD-VSS is relatively low (e.g., for lower frequency applications), the sizes of the current sources and sinks may be set relatively large. If the supply voltage difference VDD-VSS is relatively high (e.g., for higher frequency applications), the sizes of the current sources and sinks may be set relatively low. Similarly, it shall be understood that there may be more than two size levels (e.g., high and low), but multiple levels (e.g., very high, high, medium, low, very low). Accordingly, the delay sensitivity controller 560 may use an equation or a table to map the supply voltage difference VDD-VSS to the size setting control signals $\overline{S}$ and S.

The delay control circuit 570 is configured to generate the first and second control voltages VBP and VBN to set the drive of the current sources and current sinks of the delay line 505 to control or set a particular delay of the delay line 505. Accordingly, the delay control circuit 570 includes an output coupled to the current sources and current sinks of the delay line 505 (e.g., to the gates of the FETs that form the current sources and current sinks of the delay line 505). The delay control circuit 570 may generate the control signals VBP and VBN based on the size setting control signals S and $\overline{S}$ (e.g., or after the size setting control signals S and $\overline{S}$ have been determined by the delay sensitivity controller 560).

Figure 6:
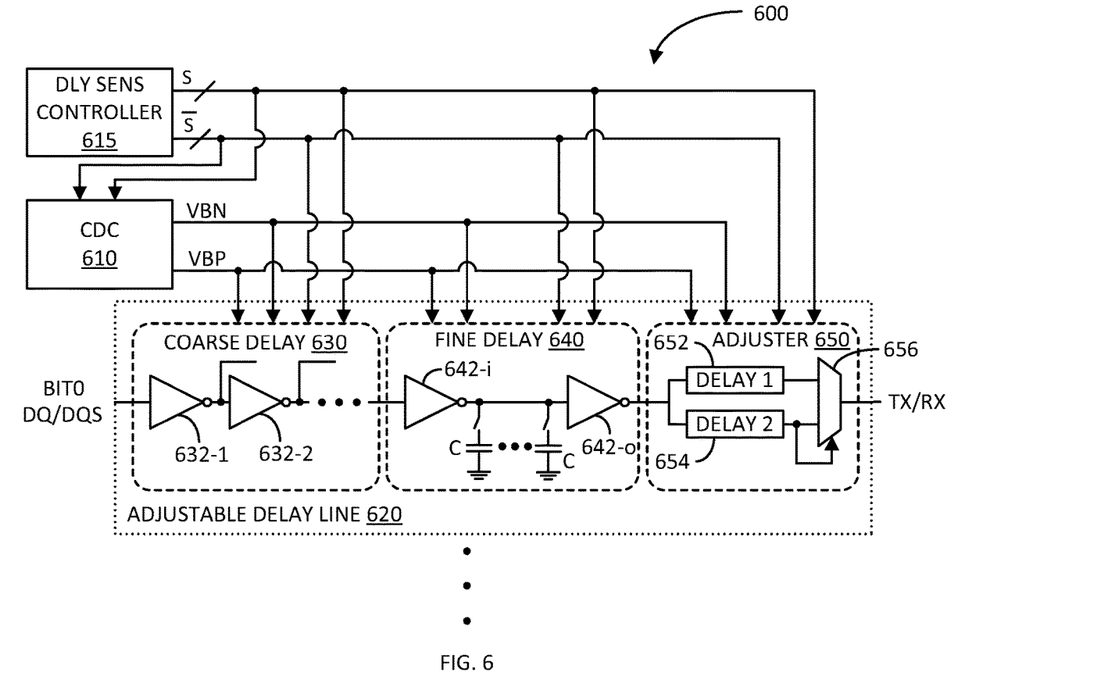
FIG. 6 illustrates a block diagram of an example double data rate (DDR) memory interface that employs a set of inverter-based delay elements in accordance with another aspect of the disclosure.

FIG. 6 illustrates a block diagram of an example memory interface 600 that uses the inverter-based delay elements previously discussed. As an example, the memory interface 600 may be a double data rate (DDR) memory interface, such as DDR5 or another version. The memory interface 600 includes a clock distribution circuit (CDC) 610 configured to generate the control voltages VBP and VBN for setting substantially the same delay for inverter-based delay elements of an adjustable delay line 620 including a coarse delay unit 630, a fine delay unit 640, and a duty cycle adjuster unit 650. The memory interface 600 further includes a delay sensitivity controller 615 configured to generate the sets of complementary and non-complementary signals $\overline{S}$ and S to set the sizes of the current sources and current sinks of the delay elements of the CDC 610 and the delay elements of the adjustable delay line 620, respectively.

A data signal DQ or clock (sometime referred to as "strobe") signal DQS may be applied to an input of the adjustable delay line 620. The adjustable delay line 620 is configured to delay the data signal DQ or clock signal DQS based on the control voltages VBP and VBN and the sets of complementary and non-complementary signals $\overline{S}$ and S to generate an output data signal at an output Tx/Rx. The adjustable delay line 620 may be associated with a particular bit of the memory interface 600, such as bit0. It shall be understood that the memory interface 600 may include a set of parallel bits (e.g., 64 bits or others), and there is an adjustable delay line for each data signal DQ and clock signal DQS of each bit. The pair of adjustable delay line for each bit is for time aligning the data signal DQ to the clock signal DQS such that the clock DQS may be used to sample the data signal DQ at a receiver for data extraction.

The coarse delay unit 630 includes a set of cascaded delay elements 632, one or more of which may be bypassed to set the delay of the coarse delay unit 630. The coarse delay unit 630 includes an input delay element 632-1 configured to receive the data signal DQ or clock signal DQS. Each of the delay elements 632-1, 632-2, and so on of the coarse delay unit 630 may be configured per any of the delay elements 300, 408-1 to 408-J, and or 508-1 to 508-K previously discussed. As discussed, each of the delay element may be configured to be controlled by the sets of complementary and non-complementary signals $\overline{S}$ and S generated by the delay sensitivity controller 615 and the control voltages VBP and VBN generated by the CDC 610.

The fine delay unit 640 includes an input delay element 642-i, an output delay element 642-o, and a set of selectable shunt capacitors C. The input delay element 642-i includes an input coupled to an output of the coarse delay unit 630, and an output coupled to an input of the output delay element 642-o. The set of selectable shunt capacitors are selectively coupled between the output of the input delay element 642-i (input of the output delay element 642-o) and a lower voltage rail (e.g., ground). The amount of delay of the fine delay unit 640 is related to the number of shunt capacitors C selected. Each of the input and output delay elements 642-i and 642-o of the fine delay unit 640 may be configured per any of the delay elements 300, 408-1 to 408-J, and or 508-1 to 508-K previously discussed. As discussed, each of the delay element 642-i and 642-o may be configured to be controlled by the sets of complementary and non-complementary signals $\overline{S}$ and S generated by the delay sensitivity controller 615 and the control voltages VBP and VBN generated by the CDC 610, as previously discussed.

The duty cycle adjuster 650 includes a first delay element "1" 652, a second delay element "2" 654, and a multiplexer 656. The first and second delay elements 652 and 654 include respective inputs coupled to an output of the fine delay unit 640 (e.g., an output of the output delay element 642-o). The first and second delay elements 652 and 654 include outputs coupled to inputs of the multiplexer 656, respectively. The output of the second delay element is also coupled to a select input of the multiplexer 656. The multiplexer 656 includes an output configured to produce the output signal of the adjustable delay line 620. The first and second delay elements 626 and 654 may comprise a set of cascaded delay elements, each configured with any of the delay elements 300, 408-1 to 408-J, and or 508-1 to 508-K previously discussed. That is, each delay element is configured to be controlled by the sets of complementary and non-complementary signals $\overline{S}$ and S generated by the delay sensitivity controller 615 and the control voltages VBP and VBN generated by the CDC 610, as previously discussed. The first and second delay elements 652 and 654 may apply different delays to the signal at the output of the fine delay unit 640.

Figure 7:
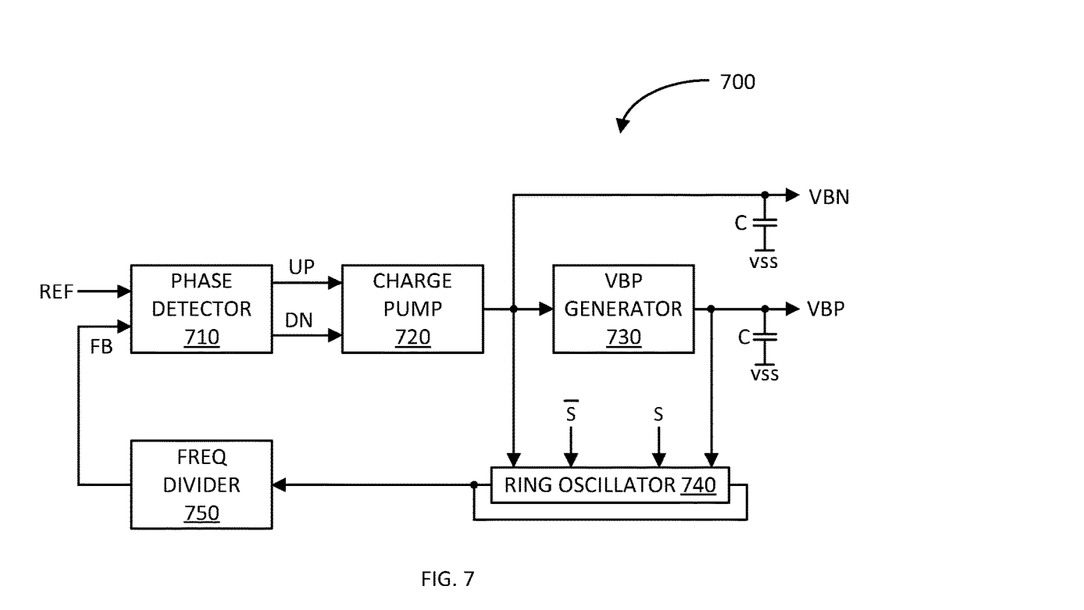
FIG. 7 illustrates a block diagram of an example clock distribution circuit (CDC) in accordance with another aspect of the disclosure.

FIG. 7 illustrates a block diagram of an example clock distribution circuit (CDC) 700 in accordance with another aspect of the disclosure. The CDC 700 may be an example implementation of the CDC 610 of the memory interface 600 previously discussed. The CDC 700 may be configured as a phase locked loop (PLL). For example, the CDC 700 includes a phase detector 710, a charge pump 720, a VBP control voltage generator 730, a ring oscillator 740, and a frequency divider 750.

The phase detector 710 includes a first input configured to receive a reference signal (REF) (e.g., from a crystal oscillator), and a second input coupled to an output of the frequency divider 750 to receive a feedback signal (FB) therefrom. The phase detector 710 includes at least one output, such as "UP" and "DN" outputs, coupled to at least one input of the charge pump 720, respectively. The charge pump 720 includes an output configured to generate the second control voltage VBN to control the current sinks of a ring of delay elements of the ring oscillator 740 and adjustable delay lines, such as adjustable delay line 620. The phase detector 710 is configured to assert a signal at the UP output to cause the charge pump 720 to increase the second control voltage VBN, and assert a signal at the DN output to cause the charge pump 720 to decrease the second control voltage VBN. The phase detector 710 generates the UP and DN signals to substantially frequency and phase align the reference and feedback signals.

The VBP generator 730 generates the first control voltage VBP based on the second control voltage VBN to control the current sources of the ring of delay elements of the ring oscillator 740 and adjustable delay lines, such as adjustable delay line 620. Shunt capacitors C are coupled between the outputs of the charge pump 720 and VBP control voltage generator 730 to reduce noise and frequency components associated with the ring oscillator signal, respectively. The delay elements of the ring oscillator 740 may be configured per any delay elements 300, 408-1 to 408-J, and or 508-1 to 508-K previously discussed. Accordingly, each delay element of the ring oscillator 740 is configured to be controlled by the sets of complementary and non-complementary signals S and S generated by, for example, the delay sensitivity controller 615 and the control voltages VBP and VBN generated by the VBP generator 730 and charge pump 720, respectively. The signal generated by the ring oscillator 740 is provided to the frequency divider 750, which frequency divides the ring oscillator signal to generate the feedback signal.

Figure 8:
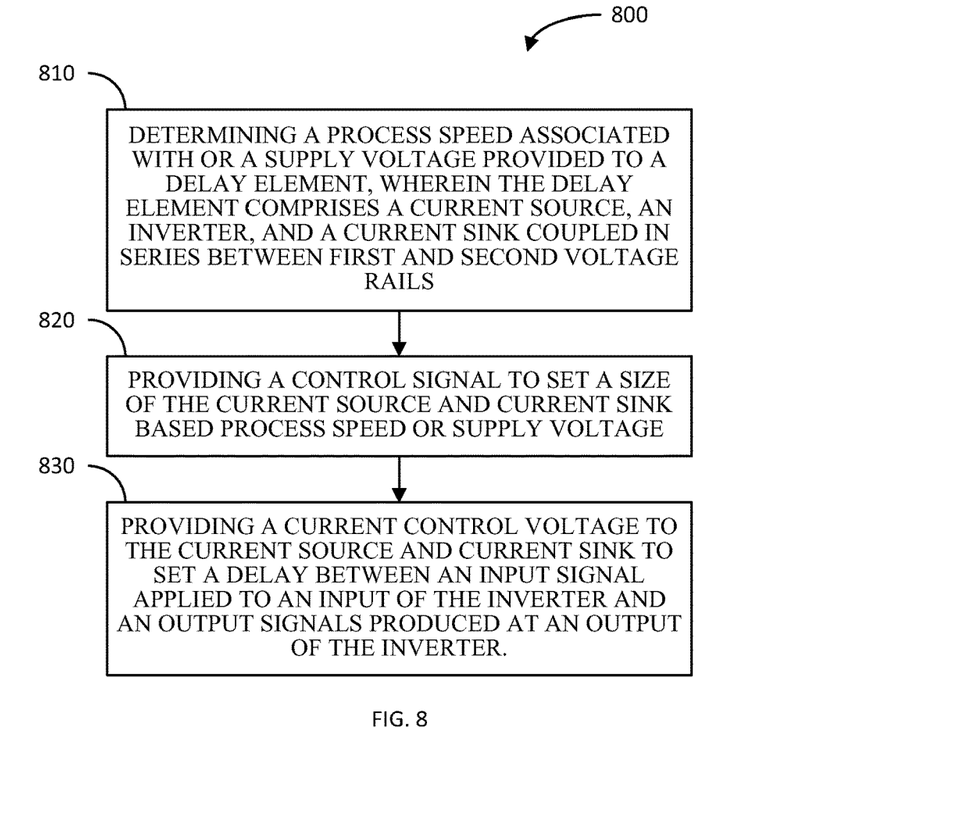
FIG. 8 illustrates a flow diagram of an example method of delaying a signal in accordance with another aspect of the disclosure.

FIG. 8 illustrates a flow diagram of an example method 800 of delaying a signal in accordance with another aspect of the disclosure. The method 800 includes determining a process speed associated with or a supply voltage provided to a delay element, wherein the delay element comprises a current source, an inverter, and a current sink coupled in series between first and second voltage rails (block 810). Examples of means for determining a process speed associated with or a supply voltage provided to a delay element include the process speed determination circuit 450 and/or the supply voltage generator 550.

The method 800 further includes providing a control signal to set a size of the current source and the current sink based on the process speed or the supply voltage (block 820). Example of means for providing a control signal to set a size of the current source and the current sink based on the process speed or the supply voltage include any of the delay sensitivity controllers 460, 560, and 615.

Additionally, the method 800 includes providing a current control voltage to the current source and the current sink to set a delay between an input signal applied to an input of the inverter and an output signal produced at an output of the inverter (block 830). Examples of means for providing a current control voltage to the current source and the current sink to set a delay between an input signal applied to an input of the inverter and an output signal produced at an output of the inverter include any of the delay control circuits 470, 570, CDC 610, and CDC 700.

According to the method 800, the providing of the control signal may include setting the size of the current source and the current sink inversely related to the determined process speed. Examples of means for setting the size of the current source and the current sink inversely related to the determined process speed include any of the delay sensitivity controllers 460, 560, and 615. Further, according to the method 800, the providing of the control signal may include setting the size of the current source and the current sink inversely related to the supply voltage. Examples of means for setting the size of the current source and the current sink inversely related to the supply voltage include any of the delay sensitivity controllers 460, 560, and 615. Additionally, the method 800 may include setting the current control voltage after setting the size of the current source and the current sink. Examples of means for setting the current control voltage after setting the size of the current source and the current sink includes an interaction between any of the delay sensitivity controllers and the delay control circuits.

Figure 9:
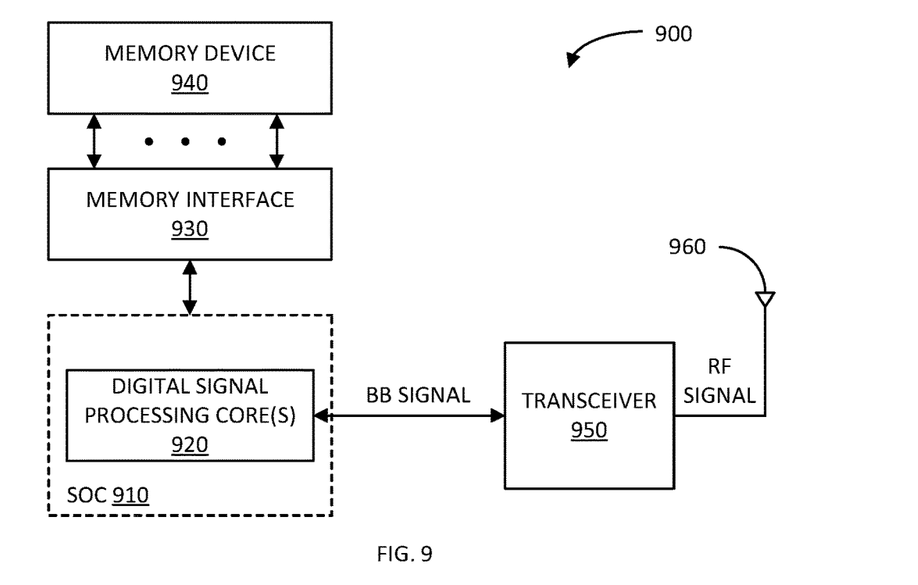
FIG. 9 illustrates a block diagram of an example wireless communication device in accordance with another aspect of the disclosure.

FIG. 9 illustrates a block diagram of an example wireless communication device 900 in accordance with another aspect of the disclosure. The wireless communication device 900 includes an integrated circuit (IC) 910, which may be configured as a system on chip (SOC), a memory interface 930 (e.g., a DDR memory interface), a memory device 940, a transceiver 950, and at least one antenna 960. The memory interface 930 may be, at least partially, configured per memory interface 600 previously discussed. Accordingly, the memory interface 930 may include delay elements configured per delay element 300 or any of the delay elements 408-1 to 408-M, or 508-1 to 508-M.

The at least one antenna 960 is configured to wirelessly receive a radio frequency (RF) receive signal and wirelessly transmit an RF transmit signal. The transceiver 950 is configured to convert the RF receive signal into a baseband (BB) receive signal, and convert a baseband (BB) transmit signal into the RF transmit signal. The one or more digital signal processing cores 920 may be configured to: process the baseband (BB) receive signal to generate a first set of data, and generate the baseband (BB) transmit signal based on a second set of data.

The one or more digital signal processing cores 920 may be configured to store the first set of data in the memory device 940, whereby the memory interface 930 assists in transferring the first set of data from the one or more digital signal processing cores 920 to the memory device 940. The one or more digital signal processing cores 920 may be configured to access the second set of data from the memory device 940, whereby the memory interface 930 assists in transferring the second set of data from the memory device 940 to the one or more digital signal processing cores 920.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
  a delay element, comprising:
    a first set of field effect transistors (FETs) including a first set of gates coupled together and configured to receive a first control voltage;
    a second set of FETs coupled in series with the first set of FETs between a first voltage rail and a first node, respectively, wherein the second set of FETs include a second set of gates configured to receive a set of complementary select signals, respectively;
    a third set of FETs, wherein the third set of FETs include a third set of gates configured to receive a set of non-complementary select signals, respectively;
    a fourth set of FETs coupled in series with the third set of FETs between a second node and a second voltage rail, respectively, wherein the fourth set of FETs include a fourth set of gates coupled together and configured to receive a second control voltage; and an inverter coupled between the first node and the second node, wherein the inverter includes an input configured to receive an input signal and an output configured to produce an output signal;

a first ring oscillator configured to generate a process speed signal indicative of a process speed of the first, second, third, and fourth sets of FETs; and a controller configured to generate the sets of complementary and non-complementary select signals based on the process speed signal.

2. The apparatus of claim 1, wherein the controller is configured to:

generate the sets of complementary and non-complementary select signals to turn on a first amount of the second and third sets of FETs based on the process speed signal indicating a first speed; and generate the sets of complementary and non-complementary select signals to turn on a second amount of the second and third sets of FETs based on the process speed signal indicating a second speed being lower than the first speed, wherein the first amount is less than the second amount.

3. The apparatus of claim 1, further comprising:

a supply voltage generator including an output coupled to at least one of the first voltage rail or the second voltage rail, wherein the controller includes an input coupled to the output of the supply voltage generator, and an output coupled to the second and third sets of gates of the second and third sets of FETs, respectively.

4. An apparatus, comprising:

a delay element, comprising:

a first set of field effect transistors (FETs) including a first set of gates coupled together and configured to receive a first control voltage;

a second set of FETs coupled in series with the first set of FETs between a first voltage rail and a first node, respectively, wherein the second set of FETs include a second set of gates configured to receive a set of complementary select signals, respectively;

a third set of FETs, wherein the third set of FETs include a third set of gates configured to receive a set of non-complementary select signals, respectively;

a fourth set of FETs coupled in series with the third set of FETs between a second node and a second voltage rail, respectively, wherein the fourth set of FETs include a fourth set of gates coupled together and configured to receive a second control voltage; and an inverter coupled between the first node and the second node, wherein the inverter includes an input configured to receive an input signal and an output configured to produce an output signal;

a supply voltage generator configured to generate a supply voltage difference between the first and second voltage rails; and a controller configured to generate the sets of complementary and non-complementary select signals based on the supply voltage difference.

5. The apparatus of claim 4, wherein the controller is configured to:

generate the sets of complementary and non-complementary select signals to turn on a first amount of the second and third sets of FETs based on the supply voltage difference being at a first level; and generate the sets of complementary and non-complementary select signals to turn on a second amount of the second and third sets of FETs based on the supply voltage difference being at a second level lower than the first level, wherein the first amount is less than the second amount.

6. The apparatus of claim 1, further comprising a control circuit including an output coupled to the first and fourth sets of gates of the first and fourth FETs, respectively.

7. The apparatus of claim 1, further comprising a control circuit configured to generate the first and second control voltages.

8. The apparatus of claim 7, wherein the control circuit is configured to generate the first and second control voltages to produce a particular delay between the output signal and the input signal.

9. The apparatus of claim 7, wherein the control circuit is configured to generate the first and second control voltages based on the sets of complementary and non-complementary signals.

10. The apparatus of claim 7, wherein the control circuit comprises a clock distribution circuit (CDC).

11. The apparatus of claim 10, wherein the CDC comprises:

a phase detector including a first input configured to receive a reference signal;

a charge pump including at least one input coupled to at least one output of the phase detector, respectively, wherein the charge pump includes an output configured to generate the second control voltage;

a first control voltage generator including an input coupled to the output of the charge pump, and an output configured to generate the first control voltage;

a second ring oscillator comprising:

a first set of inputs coupled to the outputs of the charge pump and the first control voltage generator, respectively;

a second set of inputs configured to receive the sets of complementary and non-complementary signals, respectively; and a frequency divider including an input coupled to an output of the second ring oscillator, and an output coupled to a second input of the phase detector.

12. The apparatus of claim 11, wherein the second ring oscillator comprises a ring of delay elements each configured per the delay element.

13. The apparatus of claim 1, further comprising at least one adjustable delay line, each comprising a set of cascaded delay elements each configured per the delay element.

14. The apparatus of claim 1, wherein at least one of the sets of complementary and non-complementary select signals is fixed to maintain a corresponding at least one of the FETs of the second and third sets turned on during operation.

15. A method, comprising:

operating a ring oscillator to generate a signal indicative of a process speed of devices in a delay element, wherein the delay element comprises a current source, an inverter, and a current sink coupled in series between first and second voltage rails;

providing a control signal to set a size of the current source and the current sink based on the process speed; and providing a current control voltage to the current source and the current sink to set a delay between an input signal applied to an input of the inverter and an output signal produced at an output of the inverter.

16. The method of claim 15, wherein providing the control signal comprises setting the size of the current source and the current sink inversely related to the process speed.

17. The method of claim 15, wherein providing the control signal comprises setting the size of the current source and the current sink inversely related to a supply voltage supplied to the delay element.

18. The method of claim 15, further comprising setting the current control voltage after setting the size of the current source and the current sink.

19. An apparatus, comprising:
ring oscillator means for generating a signal indicative of a process speed of devices in a delay element, wherein the delay element comprises a current source, an inverter, and a current sink coupled in series between first and second voltage rails;
means for providing a control signal to set a size of the current source and the current sink based on the process speed; and
means for providing a current control voltage to the current source and the current sink to set a delay between an input signal applied to an input of the inverter and an output signal produced at an output of the inverter.

20. The apparatus of claim 19, wherein the means for providing the control signal comprises means for setting the size of the current source and the current sink inversely related to the process speed.

21. The apparatus of claim 19, wherein the means for providing the control signal comprises means for setting the size of the current source and the current sink inversely related to a supply voltage supplied to the delay element.

22. The apparatus of claim 19, wherein the means for setting the current control voltage is configured to set the current control voltage after the means for setting the size of the current source and the current sink sets the size.

23. A wireless communication device, comprising:
a memory device;
a memory interface coupled to the memory device, wherein the memory interface comprises a plurality of delay elements each comprising:
a first set of field effect transistors (FETs) including a first set of gates coupled together and configured to receive a first control voltage;
a second set of FETs coupled in series with the first set of FETs between a first voltage rail and a first node, respectively, wherein the second set of FETs include a second set of gates configured to receive a set of complementary select signals, respectively;
a third set of FETs, wherein the third set of FETs include a third set of gates configured to receive a set of non-complementary select signals, respectively;
a fourth set of FETs coupled in series with the third set of FETs between a second node and a second voltage rail, respectively, wherein the fourth set of FETs include a fourth set of gates coupled together and configured to receive a second control voltage; and
an inverter coupled between the first node and the second node, wherein the inverter includes an input configured to receive an input signal and an output configured to produce an output signal;
at least one digital signal processing cores coupled to the memory interface;
a transceiver coupled to the at least one digital signal processing cores;
at least one antenna coupled to the transceiver;
a ring oscillator configured to generate a process speed signal indicative of a process speed of the first, second, third, and fourth sets of FETs; and
a controller configured to generate the sets of complementary and non-complementary select signals based on the process speed signal.

24. The wireless communication device of claim 23, wherein the memory interface further comprises:
a supply voltage generator, wherein the controller includes an input coupled to an output of the supply voltage generator, and an output coupled to the second and third sets of gates of the second and third sets of FETs, respectively.

25. The wireless communication device of claim 23, wherein the memory interface further comprises:
a supply voltage generator configured to generate a supply voltage difference between the first and second voltage rails, wherein the controller is configured to generate the sets of complementary and non-complementary select signals based on the supply voltage difference.

26. The wireless communication device of claim 23, wherein the memory interface further comprises a control circuit including an output coupled to the first and fourth sets of gates of the first and fourth FETs, respectively.

* * * * *